US006918461B2

(12) United States Patent
Christie

(10) Patent No.: US 6,918,461 B2
(45) Date of Patent: Jul. 19, 2005

(54) DUAL MONO CENTER CHANNEL

(76) Inventor: Cary L. Christie, 774 Mays Blvd., No. 10, Incline Village, NV (US) 89451

(*) Notice: Subject to any disclaimer, the term of this patent is extended or adjusted under 35 U.S.C. 154(b) by 0 days.

(21) Appl. No.: 10/371,045

(22) Filed: Feb. 20, 2003

(65) Prior Publication Data

US 2003/0159879 A1 Aug. 28, 2003

Related U.S. Application Data

(60) Provisional application No. 60/359,146, filed on Feb. 22, 2002.

(51) Int. Cl.[7] .......................... H05K 5/02; A47B 81/06; H04R 5/02

(52) U.S. Cl. ....................... 181/148; 181/199; 381/306; 381/27; 359/444; 353/15

(58) Field of Search ................................ 181/148, 150, 181/199; 381/300, 301, 305, 306, 307, 27

(56) References Cited

U.S. PATENT DOCUMENTS 4,266,092 A * 5/1981 Barker, III .................. 181/148
4,525,746 A * 6/1985 Mangold et al. ............ 348/838
4,961,226 A * 10/1990 Saffran ....................... 381/303
4,998,283 A * 3/1991 Nishida et al. ............ 181/161
5,027,403 A * 6/1991 Short et al. ................ 381/306
5,181,247 A * 1/1993 Holl ........................... 381/306
5,448,647 A * 9/1995 Koizumi ..................... 381/388
5,548,346 A * 8/1996 Mimura et al. ............ 348/738
5,588,063 A * 12/1996 Edgar ......................... 381/300
5,818,950 A * 10/1998 Sakamoto et al. .......... 381/420
6,040,978 A * 3/2000 Spencer ...................... 381/300
6,175,489 B1 * 1/2001 Markow et al. ............ 381/300
6,298,942 B1 * 10/2001 Schlatmann et al. ........ 181/144

FOREIGN PATENT DOCUMENTS

JP 01258587 A * 10/1989 ............ H04R/5/02

* cited by examiner

*Primary Examiner*—Edgardo San Martin
(74) *Attorney, Agent, or Firm*—Levisohn, Berger & Langsam, LLP

(57) ABSTRACT

A pair of matched monaural speakers are added inside conventional left and right stereo speaker housings so that the left, right and flat panel monitor appear joined in a seamless aesthetic effect. The added speakers are provided with center channel monaural sound, making it appear as though such sound emanates from the center of the monitor, thereby enhancing home theater impact to provide stereo and center channel sound from each left and right speaker housing.

25 Claims, 2 Drawing Sheets

DUAL MONO CENTER CHANNEL

This application claims the benefit of Provisional application Ser. No. 60/359,146, filed Feb. 22, 2002.

BACKGROUND OF THE INVENTION

This invention relates to providing center channel sound for home theater and other audio visual applications.

In the new world of multi channel audio/video there is a standard that dictates the need for 5.1 discrete sources of sound. Left front, Center, Right front, Left Rear, Right rear, and Subwoofer channels are standard for both Dolby AC3, DTS and the new DVDA and SACD audio formats. These systems are often found in surround sound systems which have become increasingly important and more widely employed throughout homes as part of home theater systems. There are a number of challenges associated with these new systems in terms of both performance and aesthetics. This invention is directed to a center channel solution that addresses both of these issues.

A typical prior art system places a discrete speaker either above or below a video monitor or television in addition to standard left and right stereo speakers. This means that the source of the center channel sound appears to come from the location of the discrete speaker. Additionally, most high performing center channel speakers are of a size which is obtrusive.

In accordance with this invention, a solution to this problem is to add a speaker to each left and right stereo speaker, mount each speaker in the same housing as the left and right speaker and provide parallel center channel signals to the added speakers, thereby producing a monaural center channel signal. This dual speaker approach places the apparent source of the sound in the center of the picture and eliminates the unsightly additional housing that usually sits above or below the TV.

This invention is directed to provide conventional left and right speaker housings which are augmented to contain the discrete center channel speakers. Each left and right speaker housing may conform to the size and shape of the new flat panel Plasma or LCD Displays that are typically wall mounted.

In a preferred embodiment, this invention provides dual center channel speakers that are mirrored on either side of a video monitor or projection screen and seamlessly fit therewith.

DETAILED DESCRIPTION OF THE INVENTION

Figure 1:
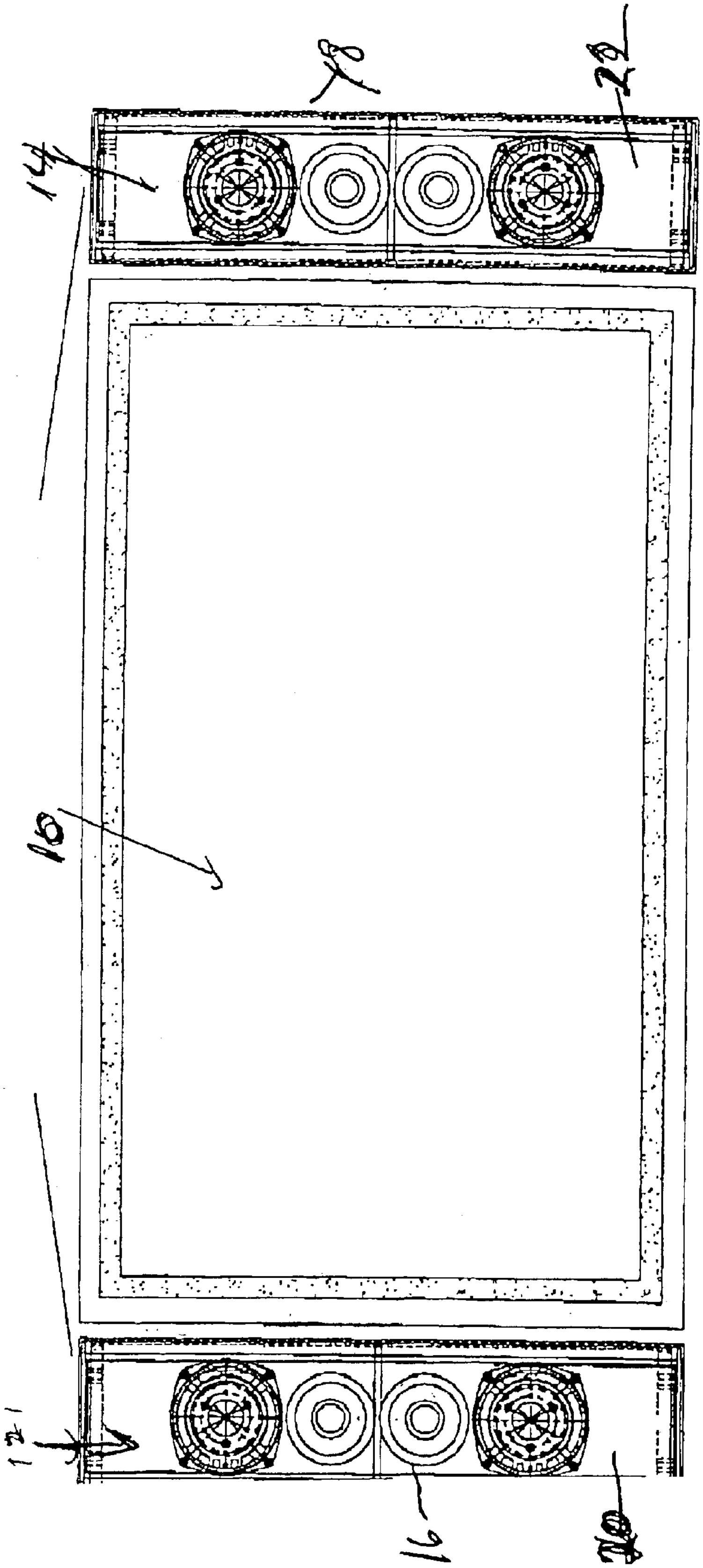
FIG. 1 is a front view of a housing for a flat panel display and a pair of side mounted speakers in accordance with the principles of this invention.

Reference is now made to FIG. 1 showing a plasma TV 10 and dual mono center channel speakers 12 and 14 located on either side of the plasma TV 10. The center channel speakers 12 and 14 are each mounted in a left and right speaker housing 16 and 18, respectively, which also contain traditional left and right stereo speakers 20 and 22. By locating the center channel speakers 12 and 14 on either side of the plasma TV, some sound will appear to be coming from the center of the TV eliminating the undesirable additional speaker housings currently distributed with such plasma TVs which are generally located on top or on the bottom of the TV. In addition, the conventional left and right stereo speaker sound will be produced from speakers 16 and 18. The center channel signal will be parallel wired to each center channel speaker.

Figure 2:
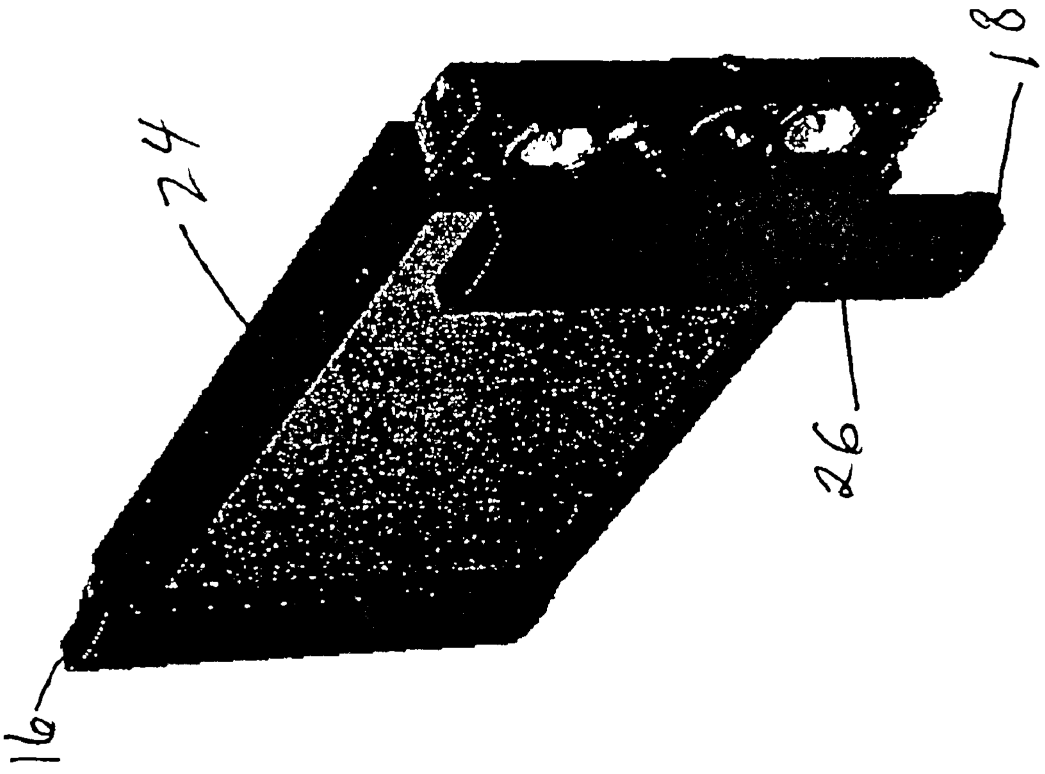
FIG. 2 is an exploded perspective view of the three components of FIG. 1, illustrating the approximate relationship of the depth of the components.

FIG. 2 illustrates, in perspective view, the components of this system which indicates that the depth of the speaker housings 16 and 18 substantially match the depth of the housing 24 for the flat panel display. Each side speaker housing has a cover 26. When this system is mounted on a wall in a conventional manner, the components are substantially adjacent to each other, and it appears as though there is one seamless uniform mount for the three components of the left speaker housing 16, flat panel display housing 24 and the right speaker housing 18.

The finish of each of the speaker housings may be identical to that of the flat panel display, could contrast with, or could be of any other suitable cosmetic appearance to provide a seamless aesthetic effect. Additionally, the speaker housings could be of substantially the same height as the flat panel display or could be different from that height, but in either case, it is preferable that the speakers be of equal height to each other.

Further, the center channel speakers may comprise high quality components conventionally found for such systems. Use of tweeters, woofers, and phase relationships between the speakers will be achieved without eliminating the three dimensional effects for surround sound systems.

It should be understood that the preferred embodiment was described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly legally and equitably entitled.

What is claimed is:

1. In combination, a flat panel monitor for displaying visual images, said flat panel monitor of the type mounted in a housing and having a center location thereof, a pair of matched speaker housings, each of said speaker housings comprising at least left and right stereo speakers, each of said speaker housings further comprising a separate center channel speaker, such that said center channel speaker is housed in the same speaker housing as respective left and right stereo speakers, said center channel speakers located substantially equidistant from the center of said monitor, each of said center channel speakers having frequency ranges which are standard for both Dolby, AC3, DTS and the DVDA and SACD audio formats, means to provide a center channel signal, said center channel signal being connected to each of said center channel speakers so as to receive the same center channel monaural signal thereby projecting aural sound therefrom which appears to come from the center of said flat panel monitor while the stereo speakers project left and right stereo sound, said center channel signal supplied only to said center channel speakers located substantially equidistant from the center of said monitor and to no other speaker unless located on opposite sides of said monitor, and to no speaker located between the sides of said monitor.

2. The combination as described in claim 1, wherein the depth of each of said speaker housings is substantially identical to the depth of the housing for said flat panel monitor.

3. The combination as described in claim 1, wherein each speaker housing has matched finishes.

4. The combination as described in claim 3, wherein the finishes of said speaker housings match the finish of the front of housing for the flat panel monitor.

5. The combination as described in claim 1, wherein the width of each speaker housing is substantially identical.

6. The combination as described in claim 5, wherein the width of each speaker housing is no larger than one quarter the width of said flat panel monitor.

7. The combination as described in claim 6, wherein the width of each speaker housing is no larger than one sixth the width of said flat panel monitor.

8. The combination as described in claim 6, wherein the width of each speaker housing is no larger than one eighth the width of said flat panel monitor.

9. The combination as described in claim 1, wherein said speaker housings are mounted to be adjacent to said flat panel monitor.

10. The combination as described in claim 1, wherein said speaker housings are mounted to be flush with the housing for said flat panel monitor.

11. The combination as described in claim 2, wherein the height of each of said speaker housings is substantially equal to the height of said housing for said flat panel display.

12. The combination as described in claim 1, wherein said housing for said flat panel monitor comprises means to mount said flat panel monitor on a wall, said speaker housings being mounted so that the front planes of said speakers are substantially in the same plane as the front of said flat panel monitor.

13. The combination as described in claim 12, wherein the height of each of said speaker housings is substantially identical to the height of the housing for said flat panel monitor.

14. The combination as described in claim 12, wherein each speaker housing has matched finishes.

15. The combination as described in claim 14, wherein the finishes of said speaker housings match the finish of the front of housing for the flat panel monitor.

16. The combination as described in claim 12, wherein the width of each speaker housing is substantially identical.

17. The combination as described in claim 16, wherein the width of each speaker housing is no larger than one quarter the width of said flat panel monitor.

18. The combination as described in claim 17, wherein the width of each speaker housing is no larger than one sixth the width of said flat panel monitor.

19. The combination as described in claim 12, wherein the width of each speaker housing is no larger than one eighth the width of said flat panel monitor.

20. The combination as described in claim 12, wherein said speaker housings are mounted to be adjacent to said flat panel monitor.

21. The combination as described in claim 12, wherein said speaker housings are mounted to be flush with the housing for said flat panel monitor.

22. In combination, a monitor for displaying visual images, a pair of speaker housings, each of said speaker housings having a left and a right stereo speaker, each of said speaker housings further comprising a center channel speaker, each of said speaker housings located on opposite sides of said monitor, each of said center channel speakers having frequency ranges which are standard for both Dolby, AC3, DTS and the DVDA and SACD audio formats, each of said center channel speakers receiving the same center channel monaural signal thereby projecting aural sound therefrom which appears to come from the center of said monitor while the stereo speakers project left and right stereo sound, wherein the center channel monaural signal being supplied only to said center channel speakers located on opposite sides of said monitor and to no other speaker unless located on opposite sides of said monitor, and to no speaker located between the sides of said monitor.

23. The combination as described in claim 20, wherein each of said speaker housings is located with respect to a wall to project substantially identical depths for said speaker housings with respect to said wall.

24. The combination as described in claim 20, wherein said monitor comprises a flat panel monitor.

25. The combination as described in claim 1 wherein said pair of matched speaker housings are substantially of identical dimensions to each other.

* * * * *